United States Patent
Searls et al.

(10) Patent No.: US 9,478,488 B2
(45) Date of Patent: Oct. 25, 2016

(54) REDUCING LOADLINE IMPEDANCE IN A SYSTEM

(71) Applicant: Intel Corporation, Santa Clara, CA (US)

(72) Inventors: Damion T. Searls, Hillsboro, OR (US); Edward P. Osburn, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 14/154,291

(22) Filed: Jan. 14, 2014

(65) Prior Publication Data

US 2014/0124942 A1 May 8, 2014

Related U.S. Application Data

(62) Division of application No. 11/588,682, filed on Oct. 27, 2006, now Pat. No. 8,659,909, which is a division of application No. 10/892,804, filed on Jul. 16, 2004, now Pat. No. 7,145,782.

(51) Int. Cl.
| | |
|---|---|
| *H05K 1/11* | (2006.01) |
| *H05K 1/14* | (2006.01) |
| *H01L 23/498* | (2006.01) |
| *H05K 1/02* | (2006.01) |
| *H05K 1/18* | (2006.01) |

(52) U.S. Cl.
CPC ....... *H01L 23/49844* (2013.01); *H05K 1/0262* (2013.01); *H01L 2224/16225* (2013.01); *H01L 2224/32225* (2013.01); *H01L 2224/73204* (2013.01); *H01L 2224/73253* (2013.01); *H01L 2924/13091* (2013.01); *H01L 2924/1531* (2013.01); *H01L 2924/19106* (2013.01); *H05K 1/023* (2013.01); *H05K 1/0231* (2013.01); *H05K 1/181* (2013.01); *H05K 2201/1006* (2013.01); *H05K 2201/10166* (2013.01); *H05K 2201/10325* (2013.01); *H05K 2201/10515* (2013.01); *H05K 2201/10545* (2013.01); *H05K 2201/10704* (2013.01); *Y10T 29/4913* (2015.01); *Y10T 29/49147* (2015.01)

(58) Field of Classification Search
CPC ................. H05K 1/0231; H05K 1/141–1/144
USPC ......................... 361/764–784, 792–795, 803
See application file for complete search history.

(56) References Cited

U.S. PATENT DOCUMENTS

| | | | | |
|---|---|---|---|---|
| 6,760,232 B2* | 7/2004 | Smith et al. | ......... | H05K 1/0263 174/260 |
| 7,095,619 B2* | 8/2006 | Panella et al. | ....... | H05K 1/0262 361/760 |
| 7,209,366 B2* | 4/2007 | Prokofiev et al. | ...... | H01L 23/50 174/520 |
| 8,018,738 B2* | 9/2011 | Doblar et al. | ....... | H05K 7/1061 174/260 |

* cited by examiner

*Primary Examiner* — Tuan T Dinh
(74) *Attorney, Agent, or Firm* — Trop Pruner & Hu, P.C.

(57) ABSTRACT

In one embodiment, the present invention includes a semiconductor device mounted to a first side of a circuit board; and at least one voltage regulator device mounted to a second side of the circuit board, the second side opposite to the first side. Examples of the voltage regulator devices include output filters, inductors, capacitors, and the like. In certain embodiments, the devices may be located directly underneath the semiconductor device.

4 Claims, 3 Drawing Sheets

REDUCING LOADLINE IMPEDANCE IN A SYSTEM

CROSS-REFERENCE TO RELATED APPLICATIONS

This application is a divisional of U.S. patent application Ser. No. 11/588,682, filed on Oct. 27, 2006, which is a divisional of U.S. patent application Ser. No. 10/892,804, filed on Jul. 16, 2004, which issued as U.S. Pat. No. 7,145,782 on Dec. 5, 2006.

BACKGROUND

The present invention relates to voltage regulators (VRs), and more specifically to placement of VR components in a system.

Voltage regulators are used in systems such as a personal computer (PC) (e.g., a desktop computer, server computer, notebook computer and the like) to receive input direct current (DC) voltages of a given voltage and convert and regulate such DC voltages to one or more regulated voltage levels required by various system components, such as integrated circuits (ICs) and the like.

In a typical system, for example, a desktop PC, a motherboard is used to support various system components, including ICs, connectors, VR components, and the like. Such VR components may include output inductors, bulk capacitors, metal oxide silicon field effect transistors (MOSFETs), driver ICs, and the like. Typically, the VR components are placed on a primary side (e.g., a topside) of the motherboard. These VR components must be placed outside an IC device's keepout zone (i.e., the IC's footprint, including any socket or heatsink retention). This placement can result in larger loadline lengths and therefore higher loadline impedance (i.e., capacitance, inductance, and resistance). In such manner, VR components may be located many centimeters away from an intended load (e.g., an IC). Accordingly, motherboard/package lateral travel dominates, increasing loadline length and therefore impedance.

Instead of the above described placement of VR components, other systems use some type of additional VR daughter module (i.e., a separate circuit board) that is plugged into the motherboard or an IC device. However, such additional circuit boards increase cost and complexity, and further increase the size of a given form factor. Furthermore, such designs typically provide inferior performance. A need thus exists to provide VR components that have reduced loadline length and impedance.

DETAILED DESCRIPTION

In various embodiments of the present invention, different components of a voltage regulator may be coupled to a secondary side of a circuit board, such as a motherboard. More specifically, such components may be placed within a keepout zone of an IC located on the primary side of the circuit board. For example, a processor of a system may be coupled to a motherboard by a socket. Such a socket may have a keepout zone associated therewith on the primary side that prevents any other component from being located within the keepout zone. Thus, by locating one or more voltage regulator components on a secondary side of the circuit board, such components may be located closer to their load (i.e., the microprocessor) than if the components were located on the primary side of the circuit board. In such manner, a substantially shorter loadline and therefore a smaller loadline impedance may be accommodated.

While the types of components that may be placed on the secondary side may vary, in certain embodiments such components may include output inductors, board bulk and high-frequency (HF) capacitors, and one or more MOSFETs. Such location of voltage regulator components may improve current and voltage transients, provide for better power delivery efficiency, and lower operating temperatures for a voltage regulator. Furthermore, such location may also enable operation at higher current levels. Further, by providing such components on a secondary side of a circuit board, additional space may be open on the primary side, which either frees up space or permits use of a smaller circuit board to support all desired components.

Figure 1:
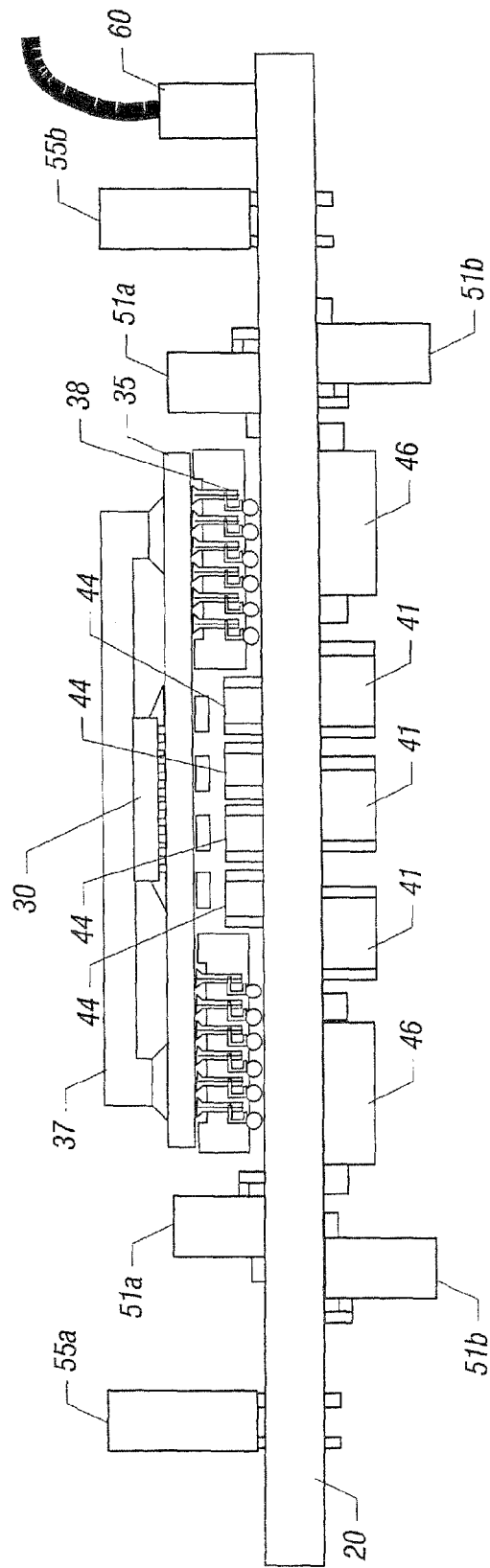
FIG. 1 is a cross-sectional view of a circuit board of a system in accordance with one embodiment of the present invention.

Referring now to FIG. 1, shown is a cross-sectional view of a circuit board of a system in accordance with one embodiment of the present invention. As shown in FIG. 1, circuit board 20 may support multiple components. As shown in FIG. 1, some components may be surface mounted onto the circuit board, while others may be mounted by use of conductive through-holes within the circuit board. Circuit board 20 may be any desired circuit board, such as a motherboard of a PC. For example, circuit board 20 may be a four-layer motherboard for a desktop computer, although the scope of the present invention is not so limited.

As shown in FIG. 1, a primary side (i.e., the upper side) of circuit board 20 supports a semiconductor device 30 (also referred to herein as "IC 30"), which may be coupled to circuit board 20 via a package 35. Package 35 may provide connections to pins of semiconductor device 30. In one embodiment, semiconductor device 30 may be a microprocessor, such as a central processing unit (CPU) of the system. In turn, package 35 may be coupled to a socket 38 that may be formed of a housing that includes conductors to couple connections from semiconductor device 30 to connections on circuit board 20.

An integrated heat spreader 37 may be mounted to package 35 (e.g., via an epoxy) and coupled to semiconductor device 30 to aid in cooling. In turn, a heat sink (not shown in FIG. 1) may be coupled to integrated heat spreader 37 to provide heat dissipation. Such a heat sink may provide retentions to circuit board 20. As shown in FIG. 1, package 35 may form a keepout zone. That is, the dimensions of package 35 define an area within which components typically cannot be mounted on circuit board 20.

To reduce loadline impedance and provide better voltage regulator operation, multiple voltage regulation components may be coupled to a secondary side (i.e., the lower side) of circuit board 20. As shown in FIG. 1, such components may include a plurality of bulk capacitors 41 and a plurality of output inductors 46. Collectively, capacitors 41 and inductor pads 46 may form one or more output inductor-capacitor (LC) filters used as output filters for a voltage regulator. Such a voltage regulator may be a single regulator with multiple phases. In other embodiments, multiple regulators may be present, each having multiple phases. In certain embodiments, such an LC filter may be located directly under semiconductor device 30 and may provide a relatively short low impedance path to the load. In some embodiments such an impedance path may be only a few millimeters, for example, between two and five millimeters.

Further shown in FIG. 1, the secondary side of circuit board 20 may support multiple MOSFETs 51b. In certain embodiments, MOSFETs 51b may act as synchronous FETs (SYNC FETs) that may be used in setting up and controlling a pulse width modulation (PWM) of the voltage regulator. While these secondary side components are shown for purposes of illustration in FIG. 1, it is to be understood that in other embodiments more, fewer or different components may be located on a secondary side of a circuit board and substantially within or near a keepout zone of an IC on the primary side.

Still referring to FIG. 1, additional components may be located on the primary side of circuit board 20. Such components may include a plurality of HF capacitors 44 that may act as decoupling capacitors. Further, a plurality of MOSFETs 51a may be located at an immediate periphery of package 35. Such MOSFETs 51a may be control FETs (CTRL FETs) used in controlling the PWM of the voltage regulator. Further components may include bulk capacitors 55a and 55b that may be used to filter incoming unregulated voltages to circuit board 20. In other embodiments, SYNC FETs 51b maybe on the primary side of a circuit board and CTRL FETs 51a may be on the secondary side. In still other embodiments, both types of FETs may be present on a secondary side of a circuit board.

Further shown in FIG. 1 is a connector 60 that is coupled to receive one or more source voltages, for example, from a power supply of the system. Such voltages may then be converted to voltages used by components on circuit board 20. For example, a 12 volt level may be converted to a lower voltage, such as a 1.3 or 0.9 volt level used by a microprocessor.

Figure 2:
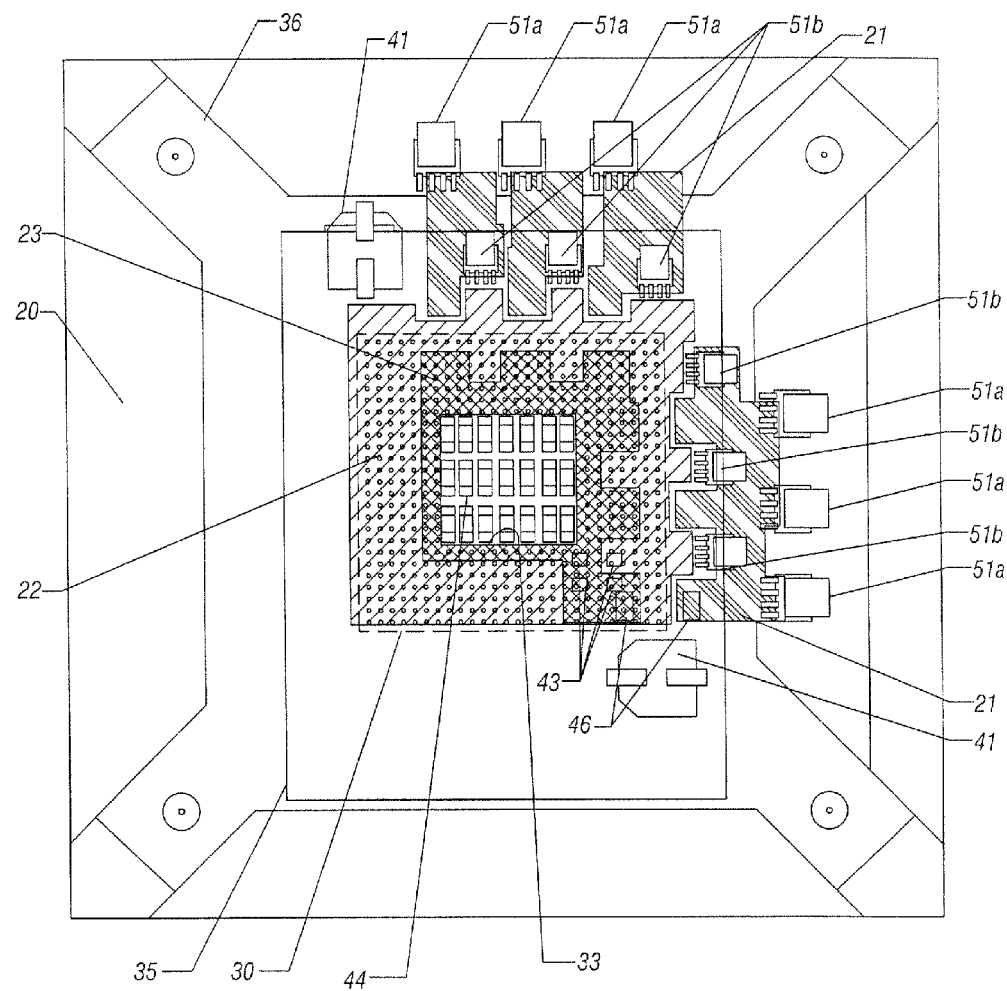
FIG. 2 is a plan view of a layout of a circuit board having an integrated circuit and voltage regulator components in accordance with one embodiment of the present invention.

Referring now to FIG. 2, shown is a plan view of a layout of a circuit board having an integrated circuit and voltage regulator components in accordance with one embodiment of the present invention. In the embodiment of FIG. 2, the VR components may be associated with a multiple phase voltage regulator, and more specifically a six-phase regulator, although the scope of the present invention is not so limited.

As shown in FIG. 2, IC 30 may be mounted to package 35, which in turn maybe mounted via a socket (not shown in FIG. 2) and a retention mechanism 36 to a top side of a circuit board 20. Interconnects of IC 30 may form a pin field within the boundaries of IC 30. IC 30 may have packaging in accordance with a land grid array (LGA) type package, although the scope of the present invention is not so limited. For example, in other embodiments, a ball grid array (BGA) package or a pin grid array (PGA) package may be used. The term "pin" is used herein to refer to any type of interconnect, and it is to be understood that such interconnects may be pins, balls, pads or other types of interconnects, in different embodiments.

Still referring to FIG. 2, IC 30 may be supported and coupled to a package 35 that in turn is coupled via board retention 36 to circuit board 20. While not shown in FIG. 2, it is to be understood that an integrated heat spreader may support heat sink and other thermomechanical components.

As shown in FIG. 2, various voltage regulator components may be positioned on a secondary side of motherboard 20, and certain of these components may be located within the keepout zone of package 35. For example, a plurality of synchronous MOSFETs 51b may be located on the secondary side. Furthermore, a plurality of output inductors may be located on the secondary side at a substantial periphery of pin field 33. Note for ease of illustration only pads 46 of a single inductor is shown in FIG. 2. Furthermore, bulk capacitors 41 may be coupled to the secondary side. As shown, bulk capacitors 41 may be located directly underneath IC 30 but outside of its pin field, in the embodiment of FIG. 2. Such bulk capacitor placement in general may improve VR stability.

Additional voltage regulator components that may be located on the secondary side may include a plurality of HF decoupling capacitors, one of which is shown in FIG. 2 as HF capacitor 43. As will be discussed below, such capacitors may be positioned between multiple planes of circuit board 20. Additional HF capacitors 44 may be coupled to a primary side of circuit board 20. Specifically, as shown in FIG. 2, primary side HF capacitors 44 may be located directly under the pin field (and substantially in the middle thereof), and in an unpopulated portion of the pin field.

Other voltage regulator components may be coupled to the primary side of circuit board 20. Such components may include a plurality of CTRL MOSFETs 51a, which may be coupled just outside a keepout zone of package 35. As shown, such CTRL MOSFETs 51a may be located substantially adjacent to SYNC MOSFETs 51b (although on the other side of circuit board 20).

Further shown in FIG. 2 are shaded regions corresponding to different planes of circuit board 20. Such planes may be various layers of circuit board 20 and corresponding interconnects of the pin field. While referred to herein as "planes" of circuit board 20, it is to be understood that such planes have corresponding areas in the pin field. As shown in FIG. 2, such planes may include a PWM plane 21 that may be used to couple CTRL MOSFETs 51a to corresponding SYNC MOSFETs 51b, a ground plane 22 and a Vcc plane 23 (i.e., a supply voltage plane). As shown in FIG. 2, PWM plane 21 may have an area that extends from a periphery of ground area 22 to couple SYNC MOSFETs 51b to CTRL MOSFETs 51a.

As shown in FIG. 2, the pin field may be formed of highly consolidated power and ground areas with substantial crenellations therebetween. Ground plane 22 may be situated substantially around a periphery of the pin field of IC 30. Ground plane 22 may have a plurality of crenellations formed therein that provide extensions to abut portions of PWM plane 21 on a peripheral side, and on a proximal side such crenellations may abut a similar crenellated pattern of Vcc plane 23. In such manner, ground plane 22 acts as an intermediate area between Vcc plane 23 and PWM plane 21, and ground plane 22 acts as a moat around Vcc plane 23.

In one embodiment, output inductors may have dimensions of approximately 0.25 inches by 0.25 inches, although the scope of the present invention is not so limited. As shown in FIG. 2 (and in a close-up in FIG. 3), in such an embodiment a PWM side inductor pad 46 (in FIG. 2) sits just outside pin field 33, while a Vcc side inductor pad 46 (in FIG. 2) sits within pin field 33. The crenellations provide a connection to such inductors and also provide a better opportunity to place HF decoupling capacitors directly between the Vcc input and the ground return planes.

Still referring to FIG. 2, the overall VR loadline may be reduced by placing SYNC FETs 51b on the secondary side within the keepout zone of package 35. Since the socket to SYNC FET conduction path should carry roughly as much current as the Vcc line, such placement may have a substantial impact on reducing the overall loadline. Due to space constraints, this embodiment may place CTRL FETs 51a on the primary side outside the socket keepout zone, although the scope of the present invention is not so limited.

Figure 3:
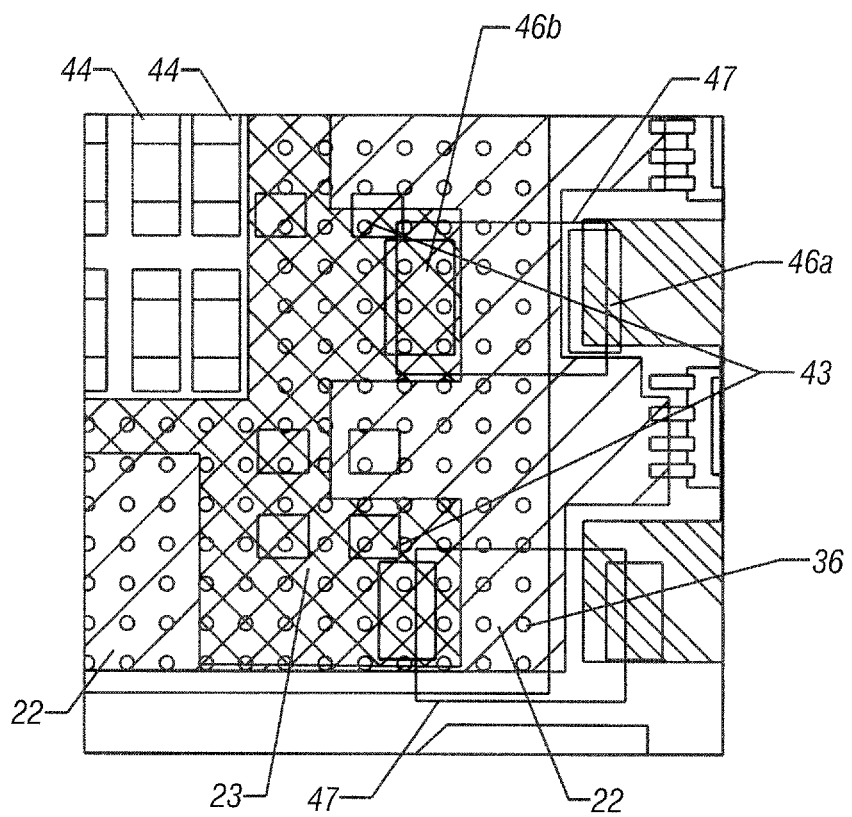
FIG. 3 is a close-up view of a portion of the circuit board of FIG. 2.

Referring now to FIG. 3, shown is a plan view of circuit board 20 of FIG. 2 and components attached thereto. More specifically, FIG. 3 is a close-up of the embodiment of FIG. 2. FIG. 3 shows in more detail a portion of the crenellation pattern between Vcc plane 23 and ground plane 22. As shown in FIG. 3, the crenellations may be of a substantially identical depth and width. While shown in the embodiment of FIG. 3 as being four socket pins deep and four (and five) socket pins wide, it is to be understood that the scope of the present invention is not so limited, and different crenellation patterns may be present in different embodiments. As shown in FIG. 3, the pin field may be formed of a plurality of primary side socket pins 36 (one of which is designated reference number 36 in FIG. 3).

Also shown in FIG. 3 are various voltage regulator components coupled to both the primary and secondary sides of circuit board 20. The primary side components include HF capacitors 44 within Vcc plane 23. Secondary side components include HF capacitors 43 which as shown, are located between Vcc plane 23 and ground plane 22. Placement of the HF capacitors within the pin field may improve performance by lowering the capacitors' parasitic loadline. Similarly, output inductors 47 (one of which is shown for illustration in FIG. 3) may be located such that a PWM side inductor pad 46a is located just outside of the pin field, while the Vcc side inductor pad 46b sits within the pin field, and more specifically within Vcc area 23. Note pads 46a and b are shown coupled to a top inductor in FIG. 3.

Thus by placing key VR components on the motherboard's secondary side, VR components may be located substantially underneath an IC device. As a result, the loadline length may be significantly shorter, resulting in a substantial drop in loadline impedance from the VR to the IC device. This reduction may result in better current and voltage transients, better power delivery efficiency and lower VR temperatures. It may also help enable higher current levels (e.g., approximately 150 amperes and more, in certain embodiments).

Also, in systems where form factor is important, VR component placement in accordance with an embodiment of the present invention may free up more motherboard space, due to the movement of key VR components to the secondary side and underneath the socket keep-out.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor device comprising:
   a package wherein the package is coupled via a socket to a primary side of a circuit board, the circuit board having a plurality of voltage regulator components on a secondary side of the circuit board; and
   a plurality of interconnects forming an interconnect field coupled to the package, the plurality of interconnects comprising:
      a first set of interconnects located at an interior portion of the interconnect field to connect to a first voltage;
      a second set of interconnects located substantially around the first set of interconnects to connect to a second voltage; and
   inductor pads to enable at least one inductor to be coupled to the secondary side of the circuit board and between a pulse width modulation plane and a supply plane of the circuit board.

2. The semiconductor device of claim 1, wherein the first set of interconnects and the second set of interconnects abut with a substantially crenellated pattern.

3. The semiconductor device of claim 1, wherein the first voltage comprises a power supply voltage and the second voltage comprises a reference voltage.

4. The semiconductor device of claim 1, wherein the plurality of voltage regulator components comprise output filters located substantially underneath the socket.

* * * * *